(12) United States Patent
Stock et al.

(10) Patent No.: US 11,971,438 B2
(45) Date of Patent: Apr. 30, 2024

(54) ANTENNA FOR USE WITH LIGHTNING DETECTION SENSOR

(71) Applicant: Earth Networks, Inc., Germantown, MD (US)

(72) Inventors: Michael Stock, Damascus, MD (US); Jeff Lapierre, Gaithersburg, MD (US); Richard Sonnenfeld, Socorro, NM (US); Curtis Generous, Great Falls, VA (US)

(73) Assignee: Earth Networks, Inc., Germantown, MD (US)

( * ) Notice: Subject to any disclaimer, the term of this patent is extended or adjusted under 35 U.S.C. 154(b) by 851 days.

(21) Appl. No.: 16/919,720

(22) Filed: Jul. 2, 2020

(65) Prior Publication Data

US 2021/0003623 A1    Jan. 7, 2021

Related U.S. Application Data

(60) Provisional application No. 62/870,248, filed on Jul. 3, 2019.

(51) Int. Cl.
*G01R 29/08* (2006.01)
*H01Q 1/48* (2006.01)
*H01Q 9/44* (2006.01)

(52) U.S. Cl.
CPC ........... *G01R 29/0842* (2013.01); *H01Q 1/48* (2013.01); *H01Q 9/44* (2013.01)

(58) Field of Classification Search
CPC .. G01R 29/0842; G01R 29/0878; H01Q 1/48; H01Q 9/44
See application file for complete search history.

(56) References Cited

U.S. PATENT DOCUMENTS

| | | | |
|---|---|---|---|
| 2,864,081 A | 12/1958 | Steelman |
| 3,121,296 A | 2/1964 | Ekstrom |
| 3,772,594 A | 11/1973 | Kuehnast |

(Continued)

FOREIGN PATENT DOCUMENTS

| | | |
|---|---|---|
| CN | 101944649 A | 1/2011 |
| JP | 2005274321 A | 10/2005 |
| WO | 199705508 A2 | 2/1997 |

OTHER PUBLICATIONS

Krider et al., Broadband Antenna Systems for Lightning Magnetic Fields, Mar. 1975, Journal of Applied Meteorology vol. 14, pp. 252-256 (Year: 1975).*

(Continued)

*Primary Examiner* — David Z Huang
(74) *Attorney, Agent, or Firm* — Cesari and McKenna, LLP

(57) ABSTRACT

Described herein is a lightning detection sensor. The lightning detection sensor comprises a sensing element that detects radio-frequency (RF) signals relating to lightning activity, a circuit that receives the detected RF signals from the sensing element and amplifies the RF signals for output to a digital signal processing device, and a reference element coupled to the circuit. The reference element is connected to an antenna ground that is isolated from a power ground, and the reference element and the antenna ground are not connected to an external ground plane.

16 Claims, 5 Drawing Sheets

(56) References Cited

U.S. PATENT DOCUMENTS

| | | | |
|---|---|---|---|
| 3,891,919 A * | 6/1975 | Penninger | G01S 1/02 324/72 |
| 4,543,580 A | 9/1985 | Bent et al. | |
| 4,588,993 A | 5/1986 | Babij et al. | |
| 4,792,806 A | 12/1988 | Bent et al. | |
| 4,801,942 A | 1/1989 | Markson et al. | |
| 4,812,852 A | 3/1989 | Bent et al. | |
| 4,901,564 A | 2/1990 | Williams et al. | |
| 4,914,444 A | 4/1990 | Pifer et al. | |
| 4,916,455 A | 4/1990 | Bent et al. | |
| 4,972,195 A | 11/1990 | Markson et al. | |
| 4,996,473 A | 2/1991 | Markson et al. | |
| 5,036,334 A | 7/1991 | Henderson et al. | |
| 5,057,820 A | 10/1991 | Markson et al. | |
| 5,140,523 A | 8/1992 | Frankel et al. | |
| 5,153,508 A | 10/1992 | Blakeslee et al. | |
| 5,295,071 A | 3/1994 | Kuzma et al. | |
| 5,295,072 A | 3/1994 | Stevens et al. | |
| 5,299,127 A | 3/1994 | Stevens et al. | |
| 5,303,152 A | 4/1994 | Moses et al. | |
| 5,305,210 A | 4/1994 | Kuzma et al. | |
| 5,319,553 A | 6/1994 | Gregg et al. | |
| 5,325,299 A | 6/1994 | Moses et al. | |
| 5,396,220 A | 3/1995 | Markson et al. | |
| 5,537,318 A | 7/1996 | Moses et al. | |
| 5,699,245 A | 12/1997 | Herold | |
| 5,771,020 A | 6/1998 | Markson et al. | |
| 5,973,898 A * | 10/1999 | Merchant | H02H 9/04 361/111 |
| 6,064,340 A | 5/2000 | Croft et al. | |
| 6,246,367 B1 | 6/2001 | Markson et al. | |
| 6,298,118 B1 | 10/2001 | Liggett | |
| 6,420,862 B2 | 7/2002 | Medelius et al. | |
| 6,552,521 B1 | 4/2003 | Medelius et al. | |
| 6,599,242 B1 | 7/2003 | Splett et al. | |
| 6,768,946 B2 | 7/2004 | Okabe et al. | |
| 6,788,043 B2 | 9/2004 | Murphy et al. | |
| 6,791,311 B2 | 9/2004 | Murphy et al. | |
| 6,791,482 B2 | 9/2004 | Koyanagi | |
| 6,868,339 B2 | 3/2005 | Murphy et al. | |
| 7,211,994 B1 | 5/2007 | Mergen et al. | |
| 7,266,345 B2 | 9/2007 | Park | |
| 7,327,271 B2 | 2/2008 | Greenstein et al. | |
| 7,460,956 B2 | 12/2008 | Murphy et al. | |
| 7,672,783 B2 | 3/2010 | Oettinger | |
| 7,788,036 B2 | 8/2010 | Neilley et al. | |
| 7,868,811 B1 | 1/2011 | Woodell et al. | |
| 7,869,953 B1 | 1/2011 | Kelly et al. | |
| 7,917,291 B2 | 3/2011 | Havin et al. | |
| 7,970,542 B2 | 6/2011 | Bent et al. | |
| 8,073,622 B2 | 12/2011 | Said et al. | |
| 8,159,369 B1 | 4/2012 | Koenigs et al. | |
| 8,275,548 B2 | 9/2012 | Marshall et al. | |
| 8,519,860 B2 | 8/2013 | Johnson et al. | |
| 8,698,640 B1 | 4/2014 | Gropper | |
| 8,836,518 B2 | 9/2014 | Marshall et al. | |
| 9,810,811 B2 | 11/2017 | Marshall et al. | |
| 9,891,345 B2 | 2/2018 | Liu et al. | |
| 2001/0048297 A1 | 12/2001 | Medelius et al. | |
| 2002/0026284 A1 | 2/2002 | Brown | |
| 2003/0025627 A1 | 2/2003 | Wilson et al. | |
| 2003/0107490 A1 | 6/2003 | Sznaider et al. | |
| 2003/0151397 A1 | 8/2003 | Murphy et al. | |
| 2003/0151398 A1 | 8/2003 | Murphy et al. | |
| 2003/0187580 A1 | 10/2003 | Okabe et al. | |
| 2004/0064255 A1 | 4/2004 | Egi | |
| 2004/0181340 A1 | 9/2004 | Smith | |
| 2004/0204854 A1 | 10/2004 | Murphy et al. | |
| 2005/0197070 A1 | 9/2005 | Kaikuranta et al. | |
| 2005/0251711 A1 | 11/2005 | Murphy et al. | |
| 2006/0125836 A1 | 6/2006 | Lojou | |
| 2007/0087697 A1 | 4/2007 | Coersmeier et al. | |
| 2007/0156339 A1 | 7/2007 | Oettinger | |
| 2007/0214023 A1 | 9/2007 | Mathai et al. | |
| 2007/0260151 A1 | 11/2007 | Clifford | |
| 2008/0085096 A1 | 4/2008 | Marshall | |
| 2008/0262732 A1 | 10/2008 | Davis et al. | |
| 2009/0164124 A1 | 6/2009 | Ryan et al. | |
| 2009/0167626 A1 * | 7/2009 | Martch | H01Q 1/50 343/850 |
| 2009/0177343 A1 | 7/2009 | Bunch et al. | |
| 2009/0281730 A1 | 11/2009 | Said et al. | |
| 2009/0295587 A1 | 12/2009 | Gorman, Jr. | |
| 2010/0218209 A1 | 8/2010 | Kendall | |
| 2011/0009111 A1 | 1/2011 | Jung et al. | |
| 2011/0040483 A1 | 2/2011 | Marshall et al. | |
| 2011/0090111 A1 | 4/2011 | Stagliano, Jr. | |
| 2011/0153742 A1 | 6/2011 | Sloop et al. | |
| 2011/0248863 A1 | 10/2011 | Johnson et al. | |
| 2013/0009780 A1 | 1/2013 | Marshall et al. | |
| 2018/0180770 A1 | 6/2018 | Liu et al. | |

OTHER PUBLICATIONS

Cummins, K. et al., "An Overview of Lightning Location Systems: History, Techniques, and Data Uses, With an In-Depth Look at the U.S. NLDN," IEEE Transactions on Electromagnetic Compatibility, IEEE Service Center, New York, NY, vol. 51, No. 3, Aug. 1, 2009, pp. 499-518.

Betz, H.D. et al., "LINET—An international lightning detection network in Europe," Atmos. Res., 2008, 10 pages.

Betz, H.D. et al., "Cell-tracking with lightning data from LINET," Adv. Geosci., 17, 55-61, 2008, 7 pages.

Schmidt, K. et al., "A Comparative Analysis of Lightning Data During the EU-Brazil TROCCINOX/TroCCiBras Campaign," VIII International Symposium on Lightning Protection, Nov. 21-25, 2005, 6 pages.

Pessi, A. and Businger, S., "Relationships among Lightning, Precipitation, and Hydrometeor Characteristics over the North Pacific Ocean," copyright 2009 American Meteorological Society, Apr. 2009, DOI: 10.1175/2008JAMC1817.1, 16 pages.

Liu, C. and Heckman, S., "Using Total Lightning Data in Severe Storm Prediction; Global Case Study Analysis from North America, Brazil, and Australia," 2011 International Symposium on Lightning Protection, Fortaleza, 2011, pp. 20-24, DOI: 10.1109/SIPDA.2011.6088433.

Yang, Y. H. and King, P., "Investigating the Potential of Using Radar Echo Reflectivity to Nowcast Cloud-to-Ground Lightning Initiation over Southern Ontario," Wea. Forecasting (2010) 25 (4): 1235-1248, DOI: 10.1175/2010WAF2222387.1.

* cited by examiner

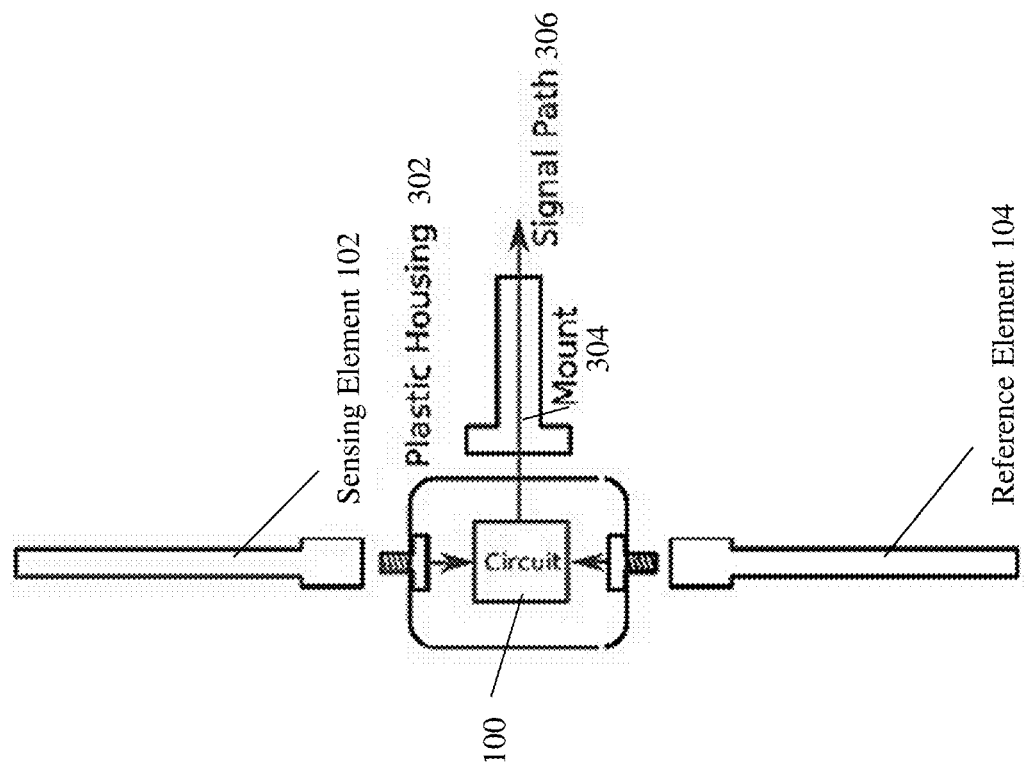

ANTENNA FOR USE WITH LIGHTNING DETECTION SENSOR

RELATED APPLICATIONS

This application claims priority to U.S. Provisional Patent Application No. 62/870,248, filed on Jul. 3, 2019, the entirety of which is incorporated herein by reference.

TECHNICAL FIELD

This application relates generally to systems and apparatuses for lightning detection, including an antenna for use with a lightning detection sensor.

BACKGROUND

The signal produced by lightning is broadband (e.g., 0 Hz-1 GHz), with the majority of the power in the lower frequency bands. The signal is very strong at low frequencies, and as a result, antennae used in lightning detection sensors typically do not need to be very efficient. Generally, current lightning detection sensor technology frequently uses monopole electric field change antennae, where the voltage output is proportional to the electric field convolved with an exponential decay.

However, this type of antenna requires a strong ground plane and a separate grounding cable to be run. In certain geographical regions (e.g., remote or underdeveloped areas with inadequate electrical infrastructure), a strong ground plane can be hard to locate and the grounding cable may be difficult to install. In addition, the grounding cable is susceptible to corrosion, breakage, and other deterioration over time which can result in inoperability of the lightning detection sensor. It is usually challenging and expensive to continuously monitor the integrity of the sensors and grounding cables, and make repairs or replacement of the grounding cables on a regular basis.

SUMMARY

Therefore, what is needed is an improved antenna design for a lightning detection sensor that overcomes the above obstacles by eliminating the need for a separate grounding cable. Embodiments of the antenna described herein utilize a center-fed dipole design, which provides the advantage of not requiring a grounding cable to be connected to the lightning detection sensor and run to a ground plane, thereby improving the efficiency and cost associated with installation and maintenance of the sensor—particularly in locations where electrical codes are not well-established (or enforced), or areas that rely on generators to provide power to the sensor. In addition, embodiments of the antenna design described herein advantageously minimize the risk of water bridging and corrosion by providing a sensor body composed of a water-resistant plastic material (e.g., thermoplastics such as polycarbonate, polyvinyl chloride (PVC) and the like) in conjunction with an asymmetric electrode design—where one electrode is positioned on an external surface of the sensor body and the other electrode is housed or embedded within the sensor body.

The invention, in one aspect, features a lightning detection sensor. The sensor comprises a sensing element that detects radio-frequency (RF) signals relating to lightning activity, a circuit that receives the detected RF signals from the sensing element and amplifies the RF signals for output to a digital signal processing device, and a reference element coupled to the circuit. The reference element is connected to an antenna ground that is isolated from a power ground, and the reference element and the antenna ground are not connected to an external ground plane.

In some embodiments, the sensing element and the reference element are comprised of an electrically conductive metal. In some embodiments, the electrically conductive metal is an aluminum alloy.

In some embodiments, the lightning detection sensor comprises a sensor body that houses one or more of the sensing element, the circuit, or the reference element. In some embodiments, the sensor body is comprised of a plastic material. In some embodiments, the plastic material is polycarbonate or polyvinyl chloride (PVC). In some embodiments, the sensor body is a cylinder. In some embodiments, the circuit is embedded in the sensor body. In some embodiments, at least a portion of the sensing element is positioned on an external surface of the sensor body and at least a portion of the reference element is embedded in the sensor body. In some embodiments, at least a portion of the sensing element is embedded in the sensor body and at least a portion of the reference element is positioned on an external surface of the sensor body. In some embodiments, the antenna ground is connected to a ground element positioned inside the sensor body.

In some embodiments, a gain of the circuit is fixed and calibrated. In some embodiments, the antenna ground is isolated from the power ground using a DC-DC converter. In some embodiments, the circuit comprises an inverting charge amplifier that amplifies the RF signals. In some embodiments, the inverting charge amplifier is a fully differential amplifier.

In some embodiments, the sensor is affixed to a mount that fastens the sensor to a physical structure. In some embodiments, the circuit is connected to a remote network via a networking port coupled to the circuit.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIG. 3 is a diagram of a lightning detection sensor according to an embodiment of the invention.

DETAILED DESCRIPTION

Figure 1:
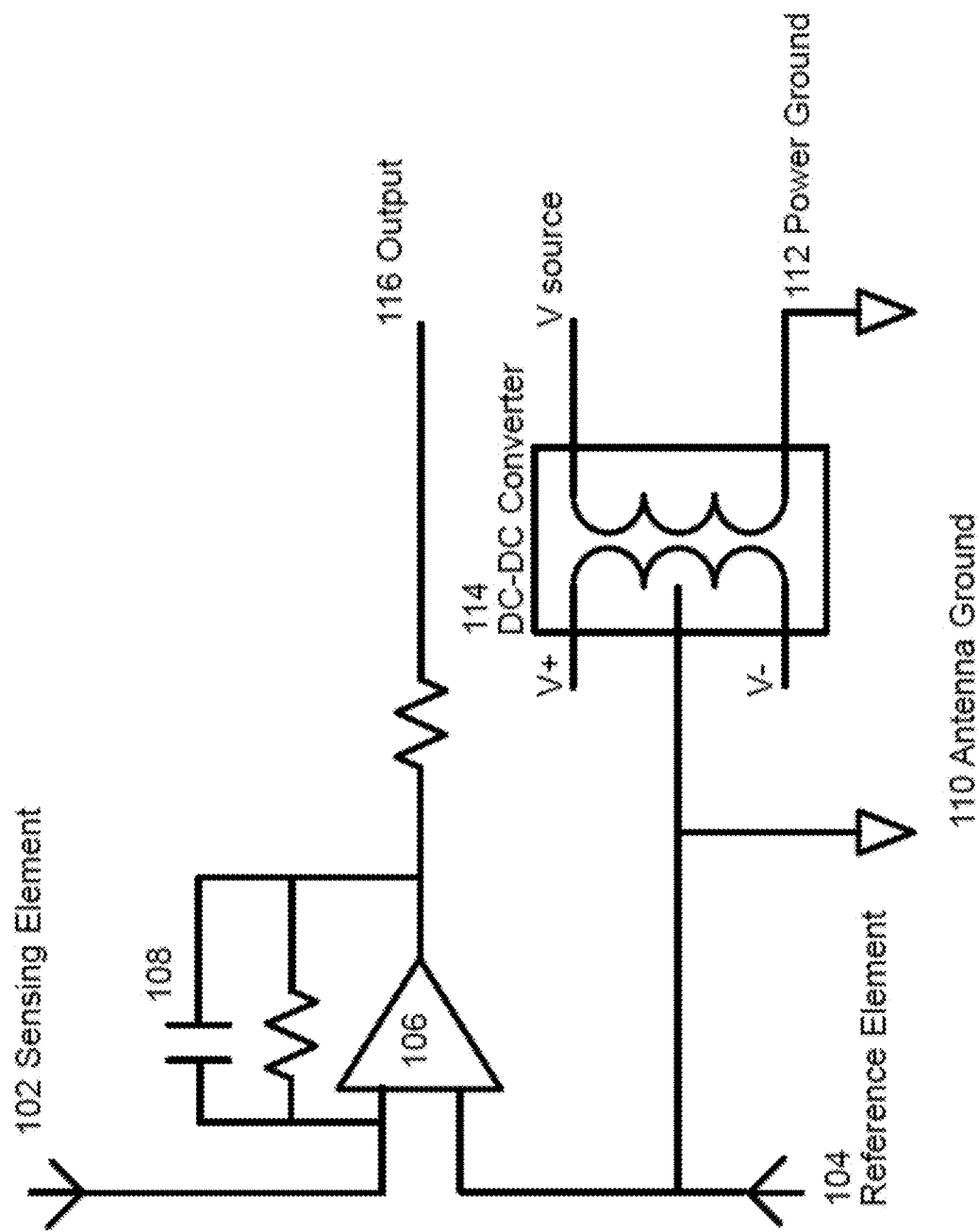
FIG. 1 is a diagram of an antenna circuit design according to an embodiment of the invention.

FIG. 1 is a diagram of an antenna circuit design 100 according to an embodiment of the invention. As shown in FIG. 1, the antenna circuit design 100 comprises a center-fed dipole design, with a sensing element 102, a reference element 104, an amplifier 106, a capacitor 108, an antenna ground 110, a power ground 112, a DC-DC converter 114, a power source 116, and a signal output 118. The sensing element 102 can comprise a device (e.g., a whip antenna, an electrode, or similar device) that detects RF signals resulting from lightning activity in the atmosphere, such as cloud-to-ground (CG) strokes and intra-cloud (IC) pulses. The sensing element 102 transfers the detected RF signals, through an optional 100 Ohm resistor, to the amplifier 106-capacitor 108 pair. In some embodiments, the amplifier 106 is an inverting charge amplifier—but it should be appreciated that other types, models, and/or configurations of the amplifier are possible. The amplifier 106 is coupled to the reference element 104 which, in some embodiments, is a whip antenna, an electrode, or similar device. In some embodiments, such as the embodiment shown in FIG. 1, the reference element 104 is coupled to the antenna ground 110 and the DC-DC converter 114. As can be appreciated, the antenna includes a reference element 104 because the electric field change has to be measured with respect to a reference. Typical monopole designs use an external earth connection. Because there is no external earth connection in the present antenna circuit design 100, the reference element 104 is required. It should be appreciated that, in some embodiments, the antenna ground 110 is not attached to anything. But, the circuit still requires a local ground to operate. In some configurations of the antenna, the reference element 104 can be attached to antenna ground (as in FIG. 1), but that is not required when using a differential input (as shown in FIG. 2).

To allow the antenna to work without strong grounding, the antenna ground 110 should be isolated from the power ground 112 of the power source 116 (e.g., a DSP board which is supplying power) by using the DC-DC converter 114. Typically, DC-DC converters include an oscillator which usually oscillates in the frequency band of the antenna. As such, care is required to both select a converter of particularly low noise, and to filter the power as well. One benefit of this is that it enables the use of a dual-supply op-amp and remove any biases on the antenna. An exemplary DC-DC converter 114 is the CC3-0505SF-E available from TDK-Lambda Corporation.

The amplifier 106 is further coupled to the signal output 118, that provides the detected RF signals to, e.g., a DSP board (not shown) for analysis and processing of the RF signals into digital waveforms representing the detected lightning activity. It should be appreciated that, in some embodiments, because the antenna gain is based on the effective area of the sensing element 102, the signal levels may be somewhat lower than lightning detection sensors that utilize other types of sensing elements (e.g., signal plate design). To compensate, the gain of the active circuitry in the sensor can be adjusted by, e.g., reducing the C value (and adjusting R to match), or by using a follower with gain after the charge amp. The passive gain is generally less location dependent because the distance between the reference element 104 and the sensing element 102 is fixed. Contrast this with a monopole antenna design, where the distance between the sensing element and the external earth is dependent upon how the antenna is installed. In some embodiments, the gain of the antenna is fixed and calibrated prior to installation of the sensor, which advantageously eliminates any variation or attenuation in gain that may result from the physical positioning of the lightning detection sensor (e.g., the height at which the sensor is installed) and therefore does not require a strong antenna ground.

Figure 2:
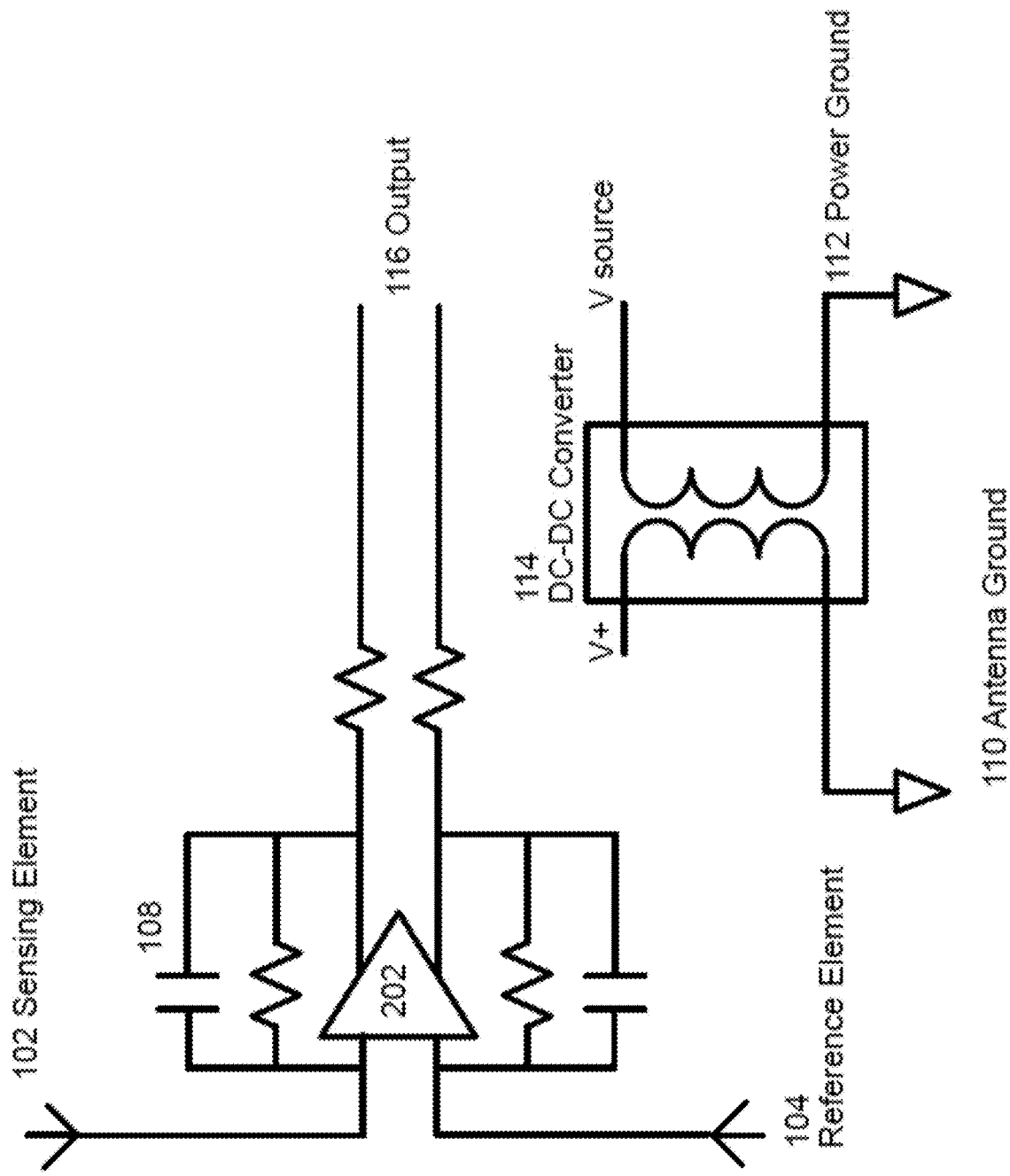
FIG. 2 is a diagram of another antenna circuit design according to an embodiment of the invention.

FIG. 2 is a diagram of another antenna circuit design 200 according to an embodiment of the invention. Many of the components shown in FIG. 2 are the same as in FIG. 1 described above, including the sensing element 102, the reference element 104, the capacitor 108, the antenna ground 110, the power ground 112, the DC-DC converter 114, the power source 116, and the signal output 118. However, as shown in FIG. 2, the amplifier 202 comprises a fully differential amplifier (such as the AD8274 precision difference amplifier available from Analog Devices of Norwood, Massachusetts). As can be appreciated, the use of a fully differential amplifier provides several benefits, including lower distortion and improved gain accuracy.

FIG. 3 is a diagram of a lightning detection sensor design 300 according to an embodiment of the invention. As shown in FIG. 3, the circuit 100 (e.g., a printed circuit board (PCB)) is enclosed within a plastic housing 302 and is coupled to the sensing element 102 and the reference element 104. For example, the sensing element 102 and the reference element 104 re whip antennas that are attached to the plastic housing 302 via screw plates, which are electrically connected to the circuit 100 via wire. The plastic housing 302 is connected to a mount 304, which can be fastened to a tower, building, or other type of structure. The signal path 306 travels from the circuit 100 via the mount 304 to, e.g., a DSP board or other module (not shown) that receives and processes the signals from the circuit 100. It should be appreciated that, in some embodiments, the DSP board can embedded within the plastic housing 302.

Figure 4A:
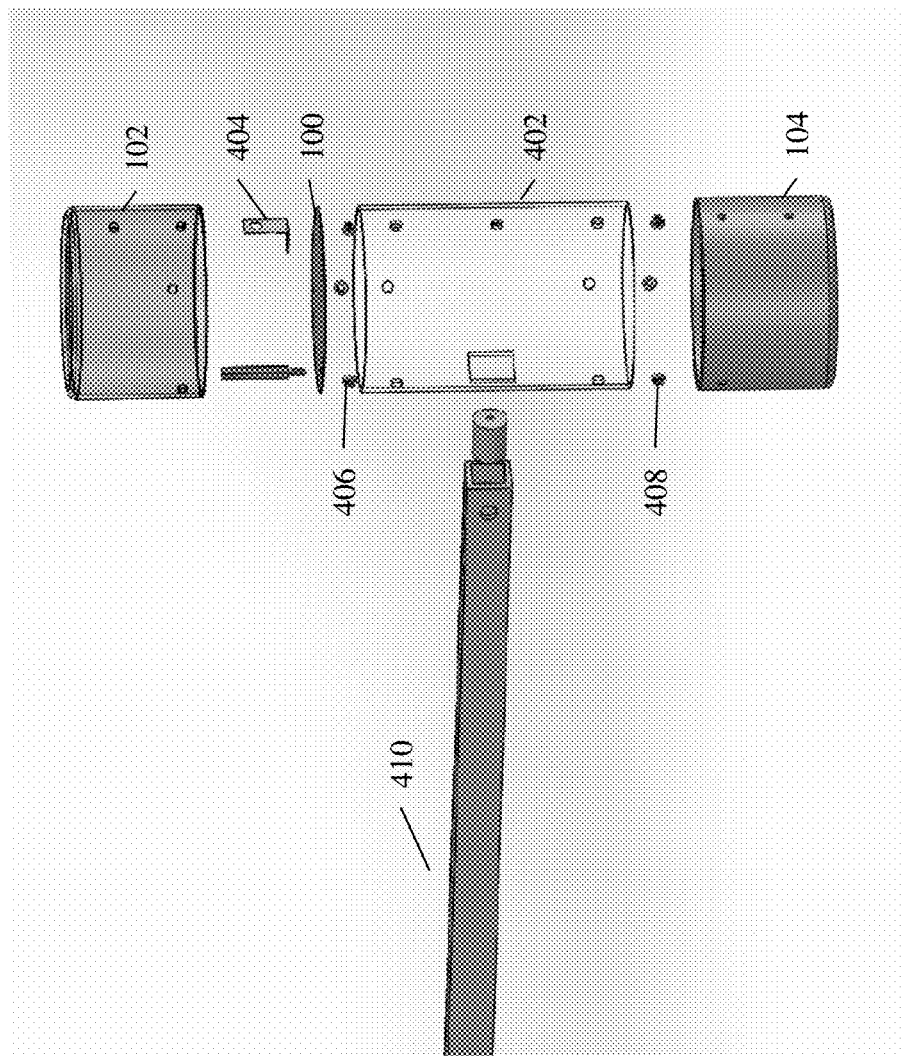
FIG. 4A is an exploded view diagram of another lightning detection sensor according to an embodiment of the invention.
Figure 4B:
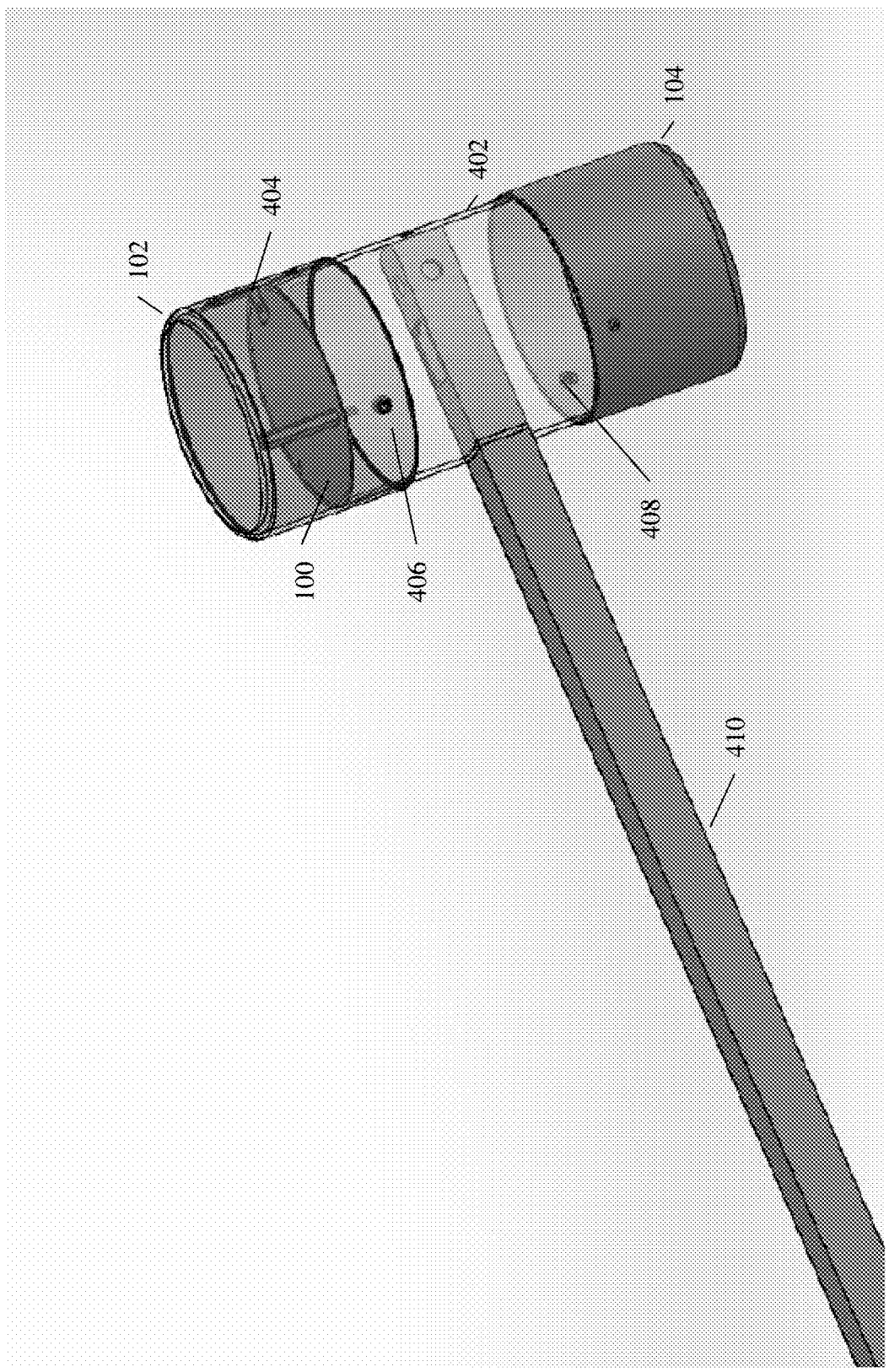
FIG. 4B is an assembled view of the lightning detection sensor of FIG. 4A.

FIGS. 4A and 4B are diagrams of another lightning detection sensor design 400 according to an embodiment of the invention. FIG. 4A provides an exploded view of the sensor design 400 showing the separated components, while FIG. 4B provides a view of the same sensor design 400 with the components fully assembled. As shown in FIG. 4A, the sensor body 402 has a cylindrical shape which can be comprised of a water-resistant plastic material (such as polycarbonate or polyvinyl chloride (PVC)). It should be appreciated that other types of plastics and/or water-resistant materials can be used without departing from the scope of invention.

The circuit 100 (e.g., PCB) is configured in a circular shape, with a diameter slightly smaller than the diameter of the sensor body 402 so that the circuit 100 can be embedded within the sensor body 402 when the sensor is fully built. In some embodiments, the circuit 100 can be mounted to a base plate (not shown) to provide stability and protection for the circuit 100. The circuit 100 and/or the base plate can be affixed to the sensing element 102 using, e.g., an L-shaped bracket 404 and screw. This L-shaped bracket 404 and screw provide the connection between the sensing element 102 and the circuit 100. The sensing element 102 is positioned at the top of the sensor body 402, and is configured with a diameter slightly larger than the diameter of the sensor body, which enables the sensing element 102 to slide down over the sensor body 402 so that at least a portion of the sensing element 102 contacts the exterior surface of the sensor body 402. The sensing element 102 is composed of an electrically-conductive metal, such as spun 1100 aluminum alloy (although other types of conductive metals can be used within the scope of invention). Once the sensing element slides over the sensor body 402, the sensing element 102 can be affixed to the sensor body 402 using, e.g., steel screws 406.

The reference element 104 is positioned at the bottom of the sensor body 402, and is configured with a diameter slightly smaller than the diameter of the sensor body, which enables the reference element 104 to slide into the sensor body 402 so that at least a portion of the reference element 104 is embedded within the sensor body and contacts the interior surface of the sensor body. The reference element 104 is composed of an electrically-conductive metal, such as spun 1100 aluminum alloy (although other types of conductive metals can be used within the scope of invention). Once the reference element 104 is at least partially embedded in the sensor body 402, the reference element 104 can be affixed to the sensor body 402 using, e.g., steel screws 408. Also, although not shown in FIGS. 4A and 4B, a wire is connected from the reference element 104 to the circuit 100 to provide the reference signal to the circuit 100.

It should be appreciated that the configuration shown in FIGS. 4A and 4B are exemplary, and other configurations of components can be envisioned. For example, in some embodiments, the sensing element 102 can be embedded at least partially inside the sensor body 402 while the reference element can be positioned at least partially on the exterior surface of the sensor body 402. In other embodiments, both the sensing element 102 and the reference element 104 can be embedded at least partially inside the sensor body 402. In still other embodiments, both the sensing element 102 and the reference element 104 can be positioned at least partially on the exterior surface of the sensor body 402—although in these latter two configurations, a risk of water bridging or moisture infiltration of the sensor interior can increase.

The sensor body 402 is further connected to a mounting bar 410 that holds the sensor in position. As can be appreciated, the sensor, via mounting bar 410, can then be affixed to another physical object (e.g., a building, a tower, or other type of structure) for the purpose of detecting lightning activity. In some embodiments, a cable or wiring can be run inside of the mounting bar to access the interior of the sensor body 402 in order to be coupled to the circuit 100, e.g., for the purpose of carrying power up to the antenna and carrying signal down from the antenna. In one embodiment, Ethernet cable can be used—although it should be appreciated that other types of cables, including a simple wire, could be used for this purpose. In some embodiments, the circuit 100 can include a networking port for interfacing with the cable. This configuration enables the circuit 100 to connect to a network for the purposes of transmitting lightning signal data to, e.g., a remote computing device. In other embodiments, a fiber optic cable could be used to transmit the signal from the antenna to an external device.

As mentioned above, an important advantage of the antenna circuit designs of FIGS. 1 and 2 and the lightning sensor designs of FIGS. 3, 4A, and 4B is the elimination of a separate external ground connection to the circuit, instead utilizing an antenna ground 110 housed within the lightning detection sensor itself. This provides the advantage of not requiring a separate grounding cable to be connected to the lightning detection sensor and run to a ground plane, thereby improving the efficiency and cost associated with installation and maintenance of the sensor.

It should be appreciated that the embodiments of the invention presented herein are exemplary, and that other configurations of the lightning detection sensor elements as described herein can be contemplated to be within the scope of the technology described. Comprise, include, and/or plural forms of each are open ended and include the listed parts and can include additional, substitute, and/or alternative parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein.

The invention claimed is:

1. A lightning detection sensor comprising:
a sensing element that detects radio-frequency (RF) signals relating to lightning activity,
a circuit that receives the detected RF signals from the sensing element and amplifies the RF signals for output to a digital signal processing device,
a reference element coupled to the circuit, and
a sensor body that houses the circuit and the reference element;
wherein the reference element is connected to an antenna ground that is isolated from a power ground,
wherein the reference element and the antenna ground are not connected to an external ground plane, and
wherein the sensor body and the reference element are not in contact with the ground.

2. The lightning detection sensor of claim 1, wherein the sensing element and the reference element are comprised of an electrically conductive metal.

3. The lightning detection sensor of claim 2, wherein the electrically conductive metal is an aluminum alloy.

4. The lightning detection sensor of claim 1, wherein the sensor body is comprised of a plastic material.

5. The lightning detection sensor of claim 4, wherein the plastic material is polycarbonate or polyvinyl chloride (PVC).

6. The lightning detection sensor of claim 1, wherein the sensor body is a cylinder.

7. The lightning detection sensor of claim 6, wherein the circuit is embedded in the sensor body.

8. The lightning detection sensor of claim 7, wherein at least a portion of the sensing element is positioned on an external surface of the sensor body and at least a portion of the reference element is embedded in the sensor body.

9. The lightning detection sensor of claim 7, wherein at least a portion of the sensing element is embedded in the sensor body and at least a portion of the reference element is positioned on an external surface of the sensor body.

10. The lightning detection sensor of claim 1, wherein the antenna ground is connected to a ground element positioned inside the sensor body.

11. The lightning detection sensor of claim 1, wherein a gain of the circuit is fixed and calibrated.

12. The lightning detection sensor of claim 1, wherein the antenna ground is isolated from the power ground using a DC-DC converter.

13. The lightning detection sensor of claim 1, wherein the circuit comprises an inverting charge amplifier that amplifies the RF signals.

14. The lightning detection sensor of claim 13, wherein the inverting charge amplifier is a fully differential amplifier.

15. The lightning detection sensor of claim 1, wherein the sensor is affixed to a mount that fastens the sensor to a physical structure.

16. The lightning detection sensor of claim 1, wherein the circuit is connected to a remote network via a networking port coupled to the circuit.

* * * * *